US008089368B2

(12) United States Patent
Hong et al.

(10) Patent No.: US 8,089,368 B2
(45) Date of Patent: Jan. 3, 2012

(54) METHOD AND APPARATUS FOR DETECTING ABNORMAL POWER CONSUMPTION OF A BATTERY IN MOBILE DEVICES

(75) Inventors: James Won-Ki Hong, Kyungsangbuk-do (KR); Joon-Myung Kang, Kyungsangbuk-do (KR)

(73) Assignee: Postech Academy-Industry Foundation, Kyungsangbuk-do (KR)

( * ) Notice: Subject to any disclaimer, the term of this patent is extended or adjusted under 35 U.S.C. 154(b) by 358 days.

(21) Appl. No.: 12/453,142

(22) Filed: Apr. 30, 2009

(65) Prior Publication Data

US 2010/0001870 A1   Jan. 7, 2010

(30) Foreign Application Priority Data

Jul. 4, 2008   (KR) .................. 10-2008-0064788

(51) Int. Cl.
G08B 21/00 (2006.01)
(52) U.S. Cl. .................. 340/636.1; 320/132
(58) Field of Classification Search .............. 340/636.1, 340/636.11–636.13; 320/127–136; 324/426, 324/427; 702/63, 65
See application file for complete search history.

(56) References Cited

U.S. PATENT DOCUMENTS

| 5,248,929 | A |   | 9/1993 | Burke |           |
|-----------|---|---|--------|-------|-----------|
| 5,600,230 | A | * | 2/1997 | Dunstan | 340/636.13 |
| 5,717,307 | A | * | 2/1998 | Barkat et al. | 340/636.1 |
| 6,278,257 | B1 | * | 8/2001 | Takada et al. | 320/134 |
| 6,495,989 | B1 | * | 12/2002 | Eguchi | 320/132 |
| 6,870,349 | B2 | * | 3/2005 | Cook | 320/132 |
| 7,630,843 | B2 | * | 12/2009 | Nguyen | 320/136 |
| 7,821,234 | B2 | * | 10/2010 | Moriya | 320/134 |
| 2004/0014489 | A1 |   | 1/2004 | Miyachi et al. | |
| 2004/0017180 | A1 |   | 1/2004 | Cook | |
| 2005/0143144 | A1 |   | 6/2005 | Shin et al. | |
| 2006/0186859 | A1 | * | 8/2006 | Fujikawa et al. | 320/134 |
| 2007/0120530 | A1 | * | 5/2007 | Nozaki | 320/130 |

FOREIGN PATENT DOCUMENTS

| JP | 10-268007 | 10/1998 |
| KR | 10-2003-0053925 | 7/2003 |
| KR | 10-0418555 | 2/2004 |
| KR | 10-2004-0037694 | 5/2004 |
| KR | 10-0605891 | 7/2006 |
| KR | 10-0623031 | 9/2006 |
| KR | 10-0698667 | 3/2007 |
| KR | 10-0753283 | 8/2007 |

* cited by examiner

Primary Examiner — John A Tweel, Jr.
(74) Attorney, Agent, or Firm — Bacon & Thomas, PLLC

(57) ABSTRACT

A method for detecting abnormal power consumption of respective batteries in mobile devices includes defining one or more operational states affecting power consumption of the batteries; collecting time-series data on an amount of the power consumption and use time of each battery in each of the operational states; calculating a power consumption rate, usage patterns, and an actual use time of the individual batteries based on the time-series data; estimating an amount of an available time remaining on the individual batteries based on average power consumption rate of all of the batteries; and comparing the estimated available time with the actual use time of the individual batteries to judge whether a power of the individual batteries is being consumed abnormally.

17 Claims, 8 Drawing Sheets ically long use of lighting (e.g., LCD, keypad lamp, backlight or the like), excessively loud sound system/unnecessarily long use of sound system (e.g., speaker, hands free speaker or the like), receiving and reading all kinds of spam messages, different habits of each user, and so on. This information on the causes as disclosed above helps detect abnormal power consumption of the battery.
METHOD AND APPARATUS FOR DETECTING ABNORMAL POWER CONSUMPTION OF A BATTERY IN MOBILE DEVICES

FIELD OF THE INVENTION

The present invention relates to a method and apparatus for detecting abnormal power consumption of a battery in a mobile device, and more specifically, to a method and apparatus of detecting abnormal power consumption and available time of a battery based on average power consumption rate of batteries.

BACKGROUND OF THE INVENTION

Since the biggest feature of a mobile device is its mobility or portability, the mobile device depends entirely on its battery for power supply. In this mobile device, therefore, it is very important to secure an extended lifetime of the battery by using the battery in a very efficient and stable manner.

In order to secure an extended lifetime of the battery, studies have been made in diverse aspects. There are, for example, a study to increase the battery capacity itself through high integration of the battery, a study to reduce power consumption of the battery by way of the system architecture level through the adoption of a low power-consumption design, a study to detect and reduce unnecessary use of the battery, and so on.

In studies on how to stably extend a lifetime of the battery by detecting and reducing unnecessary use of the battery, a battery drain is the major target being detected or monitored. The battery drain is a phenomenon that the battery drains more quickly than normal due to unnecessary processes or abnormal operations of the mobile device. In relation to the battery drain, there have been studies to estimate the amount of available time remaining on the battery by way of a circuit level or through simulations. A recently developed technique involves a statistical approach to estimate available time of the battery.

The study on abnormal power consumption of the battery is usually done by mobile device manufacturers. Examples of the abnormal power consumption include the operation of an unnecessary process, changes in propagation environment (e.g., strong-weak electric field, superposition, existence of propagation shadow region, interference, etc.), frequent changes in communication modes (e.g., mode change between CDMA 1x and CDMA 1x EV-DO), an influence from a service type of a radio base station in case of a frequent operation of keys and a use of additional functions offered by Internet, excessively bright lighting/unnecessarily long use of lighting (e.g., LCD, keypad lamp, backlight or the like), excessively loud sound system/unnecessarily long use of sound system (e.g., speaker, hands free speaker or the like), receiving and reading all kinds of spam messages, different habits of each user, and so on. This information on the causes as disclosed above helps detect abnormal power consumption of the battery.

Meanwhile, a variety of studies on estimating available time of the battery have been made to date, but there were few studies on methods or devices for detecting abnormal power consumption of the battery using estimated available time of the battery. In other words, there are no practical methods or devices to diagnose and detect the abnormal or unnecessary power consumption of the battery in the early stage.

Therefore, although the possible abnormal power consumption has been already analyzed as noted earlier, the mobile device manufacturers failed to prevent or detect the problem in the early stage.

SUMMARY OF THE INVENTION

It is, therefore, a primary object of the present invention to provide a method and apparatus capable of effectively detecting abnormal power consumption of a battery based on an average power consumption rate acquired by employing a variety of statistical information of mobile devices.

In accordance with an aspect of the present invention, there is provided a method for detecting abnormal power consumption of respective batteries in mobile devices, including:

defining one or more operational states affecting power consumption of the batteries;

collecting time-series data on an amount of the power consumption and use time of each battery in each of the operational states;

calculating a power consumption rate, usage patterns, and an actual use time of the individual batteries based on the time-series data;

estimating an amount of an available time remaining on the individual batteries based on average power consumption rate of all of the batteries; and comparing the estimated available time with the actual use time of the individual batteries to judge whether a power of the individual batteries is being consumed abnormally.

In accordance with another aspect of the present invention, there is provided an apparatus for detecting abnormal power consumption of respective batteries in mobile devices, including:

a collector for collecting time-series data on an amount of a power consumption and use time of each battery in one or more operational states affecting the power consumption of the batteries;

an analyzer for calculating a power consumption rate, usage patterns, and an actual use time of the individual batteries based on the time-series data;

a planner for estimating an amount of available time remaining on the individual batteries on the basis of an average power consumption rate of all of the batteries, and for comparing the estimated available time with the actual use time of the individual batteries to judge whether a power of the individual batteries is being consumed abnormally; and an executor for reporting to a user the judgment result on whether the power of the battery is being consumed abnormally.

BRIEF DESCRIPTION OF THE DRAWINGS

The above and other objects and features of the present invention will become apparent from the following description of embodiments, given in conjunction with the accompanying drawings, in which:

FIG. 6 shows several power consumption rates, in which

DETAILED DESCRIPTION OF THE EMBODIMENTS

Hereinafter, the operational principle of the present invention will be described in detail with reference to the accompanying drawings. In the following description, well-known functions or constitutions will not be described in detail if they would obscure the invention in unnecessary detail. Further, the terminologies to be mentioned below are defined in consideration of functions in the present invention and may vary depending on a user's or an operator's intention or practice. Therefore, the definitions should be understood based on all the contents of the specification.

Figure 1:
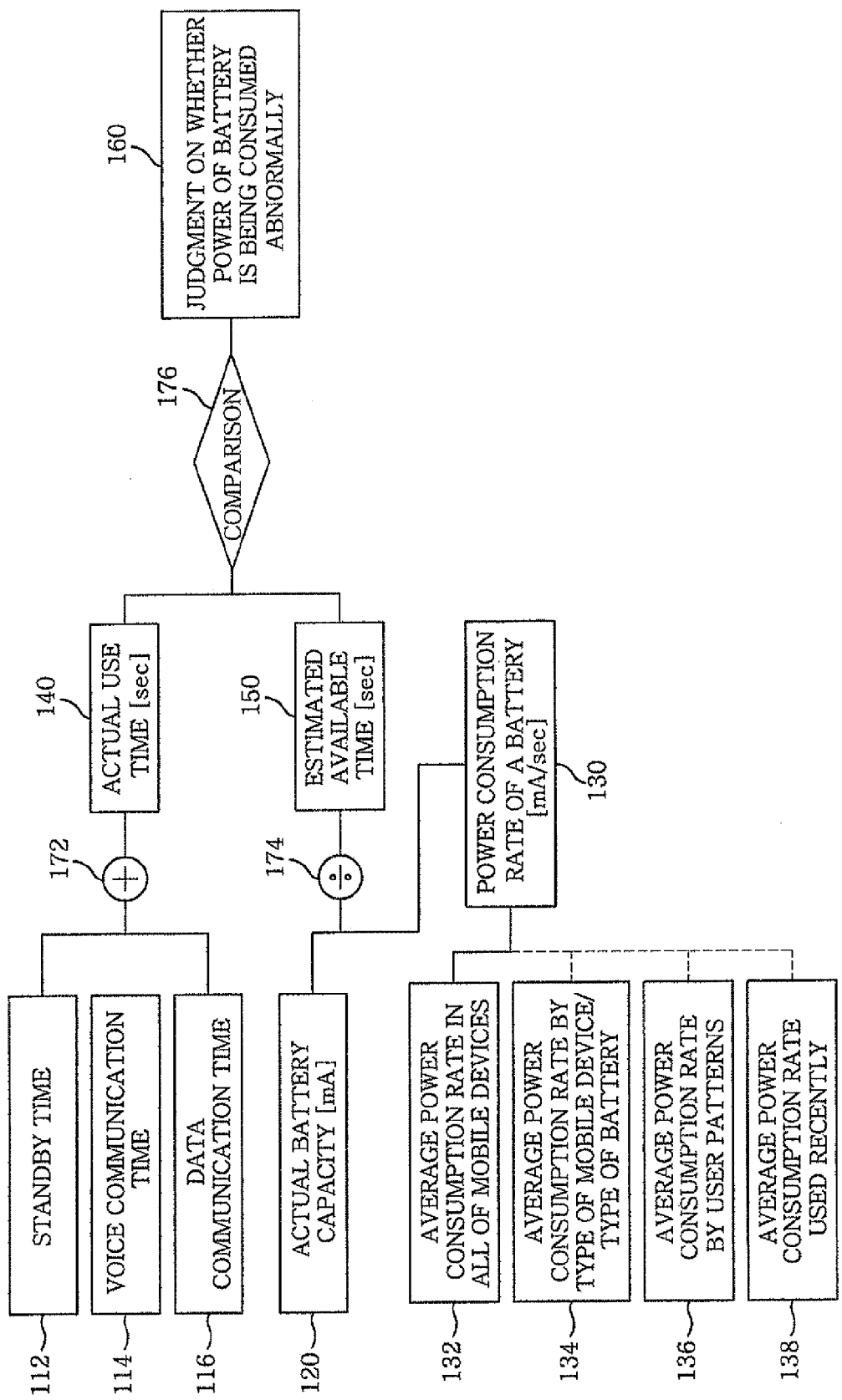
FIG. 1 is a conceptual view explaining the principle of detecting abnormal power consumption of a battery in a mobile device based on comparison between an actual use time and an estimated available time of the battery.

FIG. 1 is a conceptual view describing the principle of detecting abnormal power consumption of a battery in a mobile device based on comparison between an actual use time and an estimated available time of the battery. First, it is assumed that the mobile device is used exclusively for voice communication and data communication. Then, it becomes possible to define every possible operational state of the mobile device (e.g., standby state, voice communication state, and data communication state), and to analyze power consumption amount and use time of the battery in each operational state.

In this case, an actual use time 140 can be expressed as a sum 172 of standby time 112 at standby state, voice communication time 114 at voice communication state, and data communication time 116 at data communication state. Also, an estimated available time 150 remaining on the battery can be computed by dividing 174 an actual battery capacity 120 by a power consumption rate 130. The power consumption rate 130 may include average power consumption rate 132 for a plurality of batteries, average power consumption rate 134 by types of the mobile devices and the batteries, average power consumption rate 136 by usage patterns of the users, and average power consumption rate 138 of the battery used recently.

In this case, an actual use time 140 can be expressed as a sum 172 of standby time 112 at standby state, voice communication time 114 at voice communication state, and data communication time 116 at data communication state. Also, an estimated available time 150 remaining on the battery can be computed by dividing 174 an actual battery capacity 120 by a power consumption rate 130. The power consumption rate 130 may include average power consumption rate 132 for a plurality of batteries, average power consumption rate 134 by types of the mobile devices and the batteries, average power consumption rate 136 by usage patterns of the users, and average power consumption rate 138 of the battery used recently.

If a difference from a comparison 176 between the actual use time 140 and the estimated available time 150 exceeds a specific error range, it means that there occurs abnormal power consumption such as a battery drain 160.

Figure 2:
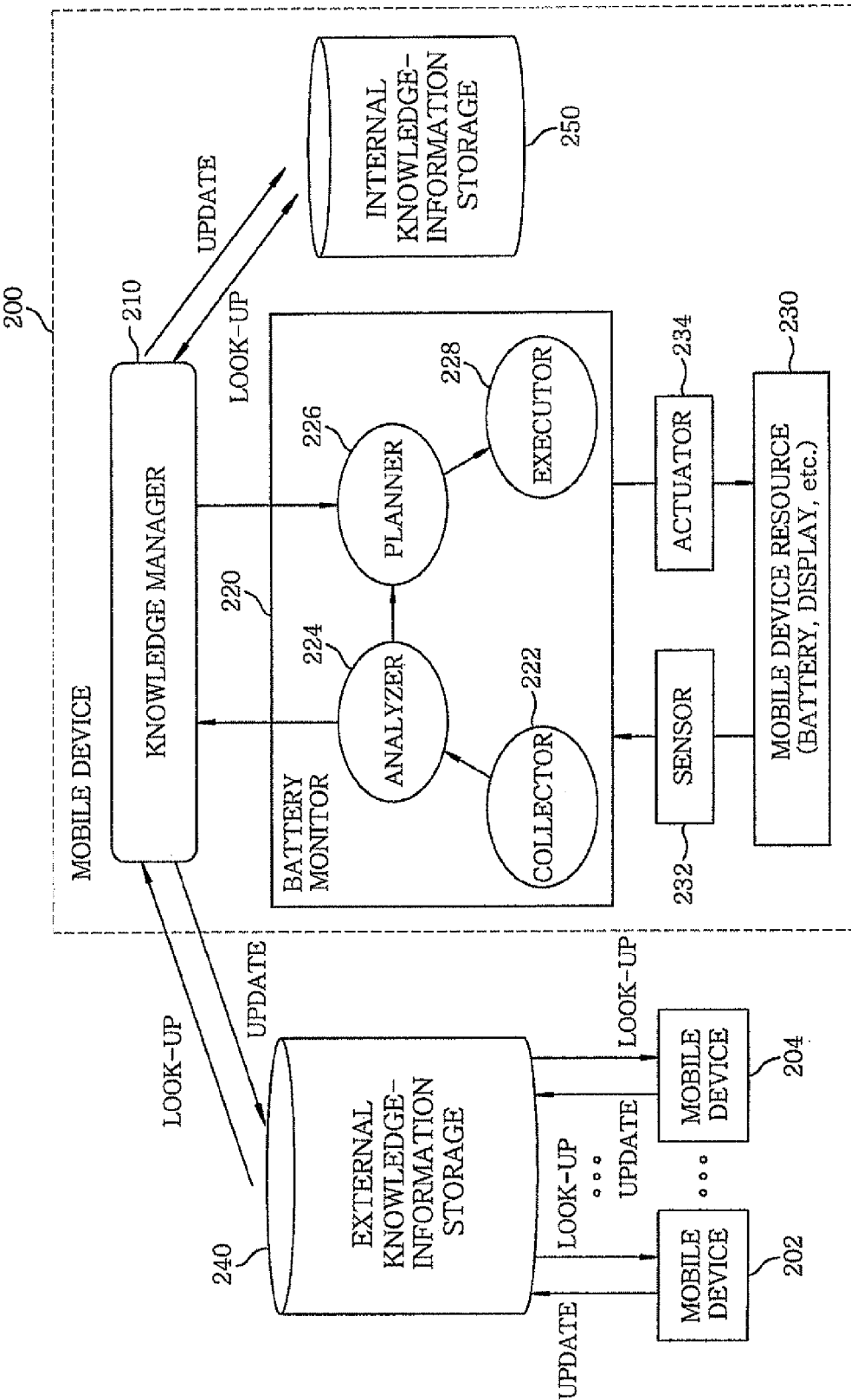
FIG. 2 shows a block diagram of an apparatus for detecting abnormal power consumption of a battery in a mobile device in accordance with an embodiment of the present invention.

FIG. 2 illustrates a block diagram of an apparatus for detecting abnormal power consumption of batteries in mobile devices in accordance with the present invention. The mobile devices 200, 202, and 204 are connected to external knowledge-information storage 240 through a network. The external knowledge-information storage 240 obtains information on power consumption rates of the batteries from the mobile device 200, 202 and 204, and then calculates an average power consumption rate of the batteries for the mobile devices. The calculated average power consumption rate is then stored in the external knowledge-information storage 240 and is updated whenever the power consumption rate of the battery is received from each mobile device 200, 202, 204. Moreover, in the external knowledge-information storage 240, the average power consumption rate may be categorized into three groups, i.e., a group by types of the mobile devices and the batteries, a group by usage patterns of the users, and a group of the mobile devices used recently.

Each of the mobile devices 200, 202, and 204 includes a knowledge manager 210, a battery monitor 220, a sensor 232, an actuator 234, a mobile device resource 230 and an internal knowledge-information storage 250.

The mobile device resource 230 represents hardware and software of the mobile device 200 and includes the battery, a display for images, a speaker for sound, a vibration motor occurring vibration, etc.

The sensor 232 measures the consumption of the mobile device resource 230, e.g., power consumption amount of the battery and use time (e.g. voice communication time, data communication time, standby time, etc.) of the mobile device 200 to produce time-series data for battery resource. The time-series data is then provided to the battery monitor 220.

The knowledge manager 210 obtains the average power consumption rate from the external knowledge-information storage 240 and provides it to the battery monitor 220 and the internal knowledge-information storage 250.

The internal knowledge-information storage 250 stores the average power consumption rate provided from the external knowledge-information storage 240 or the power consumption rate of the battery in the mobile device 200.

The battery monitor 220 performs a series of processes of collecting and analyzing the time-series data of the battery resource information measured by the sensor 232, estimating the available time of the battery, and judging whether or not power of the battery is being consumed abnormally.

Figure 3:
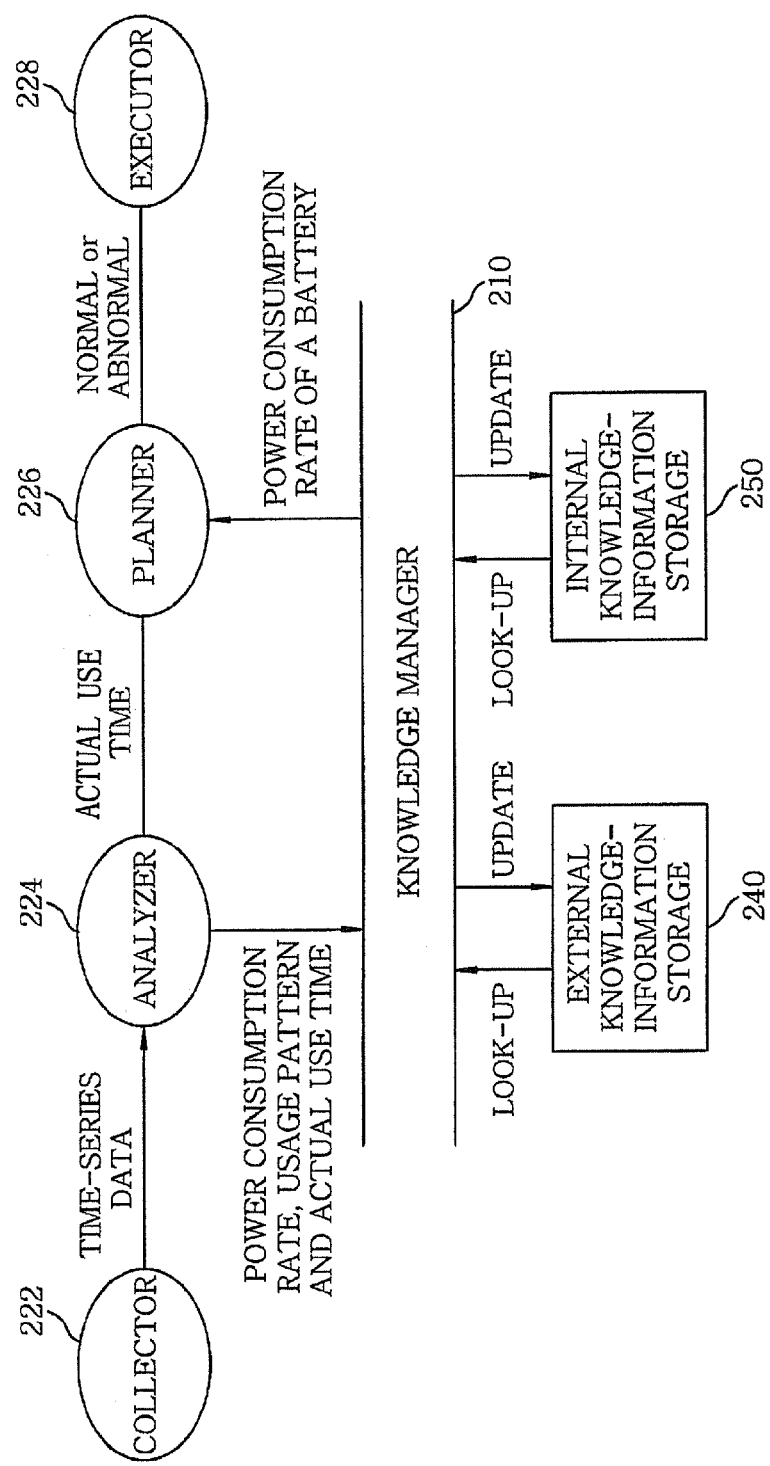
FIG. 3 illustrates a flowchart describing a data processing procedure within the battery monitor shown in FIG. 2.

Such a battery monitor 220 includes a collector 222, an analyzer 224, a planner 226 and an executor 228 whose operation will be disclosed with reference to FIG. 3 describing data processing procedure performed by the battery monitor 220.

The collector 222 is connected to the mobile device resource 230 via the sensor 232 and functions to collect the time-series data for the power consumption amount of the battery and the use time in each operational state of the mobile device 200 (e.g., standby state, voice communication state, and data communication state).

The analyzer 224 calculates the power consumption rate of the battery, usage patterns, and the actual use time of the mobile device 200 based on the time-series data from the collector 222. The calculated actual use time is then provided to the planner 226, and the calculated actual use time, power consumption rate and usage pattern are provided to the knowledge manager 210.

The knowledge manager 210 receives the average power consumption rate and provides it to the planner 226. In addition, the knowledge manager 210 allows the external or internal knowledge-information storage 240 or 250 to update the average power consumption rate or the power consumption rate, respectively, whenever the knowledge manager 210 receives the power consumption rate of the battery, the usage pattern and the actual use time from the analyzer 224.

Thereafter, upon receipt of the average power consumption rate from the external knowledge-information storage 240, the planner 226 estimates the available time of the battery. Further, the planner 226 compares the actual use time provided from the analyzer 224 with the estimated available time to judge whether or not the power of the battery is being consumed abnormally, that is, whether or not there is a battery drain. The judgment result regarding the abnormality in power consumption of the battery is then sent to the executor 228 to be reported to a user.

The executor 228 obtains the judgment result on the existence of abnormality in the power consumption of the battery from the planner 226 and reports it to a user through the actuator 234. The actuator 234 includes a display driver for informing the user of the abnormality by using a visual image, a speaker driver for informing the user of the abnormality by using an aural sound, and a vibration motor driver for informing the user of the abnormality by using a vibration.

Figure 4:
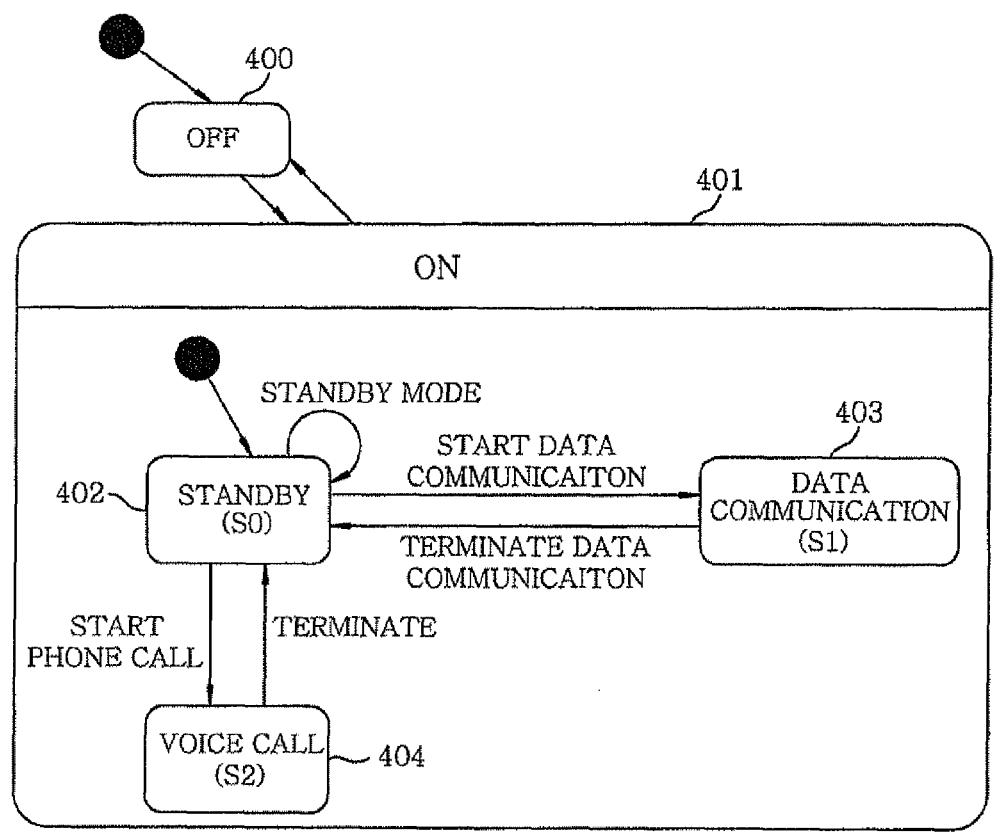
FIG. 4 presents a state diagram defining possible states in a mobile device.

FIG. 4 is a state diagram defining possible states in a mobile device. It is assumed in this embodiment that the mobile device 200 is used only for voice communication and data communication, and the states exist independently each other when defining the following states. In general, a mobile device 200 can be either in 'OFF' state 400 or in 'ON' state 401. The 'ON' state 401 may be further divided into three states: a standby state 402, a data communication state 403, and a voice communication state 404.

At an initial stage, the mobile device 200 stays in 'OFF' state 400 if power is off, and thereafter changes to 'ON' state 401 as soon as a user turns on the mobile device. The initial state of 'ON' state 401 is the standby state 402 which is indicated as S0. In the standby state 402 (S0) where a user awaits to start voice communication or data communication, if the user starts the data communication, then the mobile device changes to the data communication state 403, which is indicated as S1. When the user terminates the data communication, the mobile device changes back to the standby state 402 (S0). In the state of 402 (S0), if the user starts a phone call for the voice communication, the mobile device changes to the voice communication state 404, which is indicated as S2. When the user terminates the phone call, the mobile device changes back to the standby state 402 (S0). And if the user turns off the power, then the mobile device changes from 'ON' state 401 to 'OFF' state 400.

In the mobile device used at present, all of the states, 'OFF' state 400, 'ON' state 401, and the standby state 402 (S0) through the voice communication state 404(S2), are mutually exclusive and independent.

Figure 5:
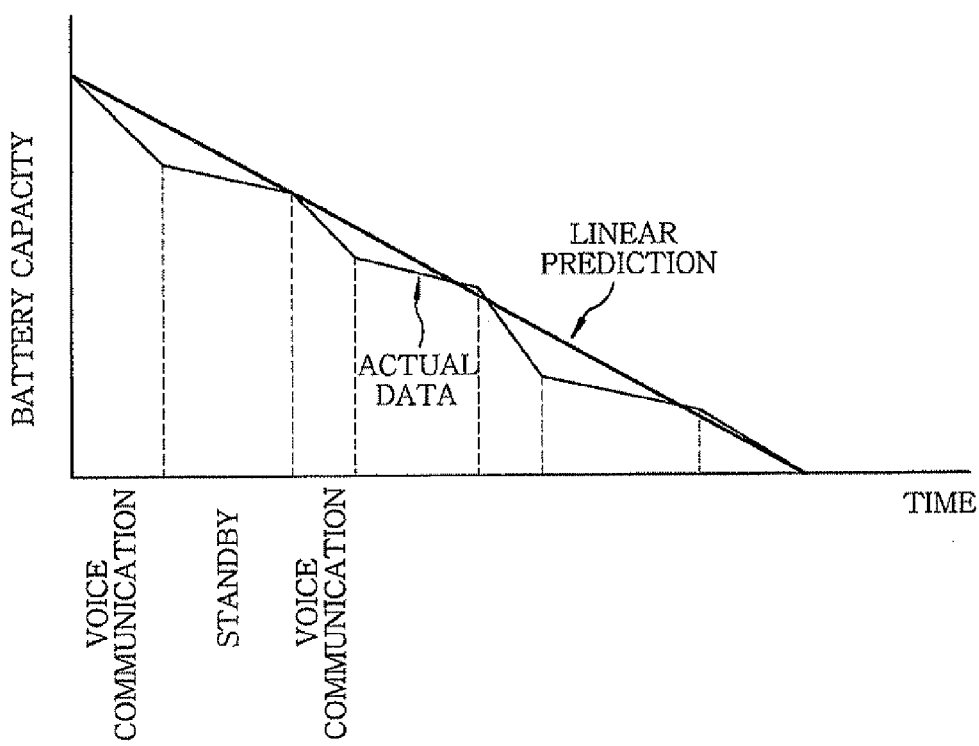
FIG. 5 graphically shows how to calculate a power consumption rate based on time-series data on power consumption amount and use time of a battery in each state.

FIG. 5 graphically shows how to calculate the power consumption rate of the battery based on the time-series data for the power consumption amount of the battery and the use time of the mobile device in each state.

The power consumption rate of the battery is obtained, under the prior knowledge of the actual battery capacity of the mobile device, by measuring an amount of time that the mobile device actually has been used until the battery is completely exhausted, and then applying the measured amount of time to a linear prediction technique. As described above, it may also be possible to categorize the power consumption rates of each mobile device into more than one group by several criteria, and to calculate the average power consumption rate of the batteries for each group. For example, if the type of mobile device and the type of battery are identical to each other, or if the same user is involved, the average power consumption rate can be calculated separately for each group. Likewise, a recent average power consumption rate can be calculated separately by categorizing data within a certain period of recent days.

FIGS. 6A to 6D show power consumption rates categorized into four different groups.

Figure 6A:
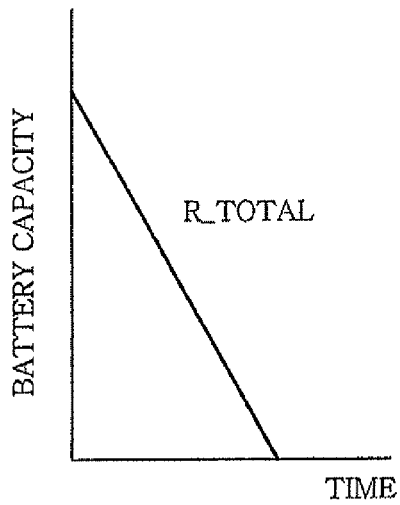
FIG. 6A shows an average power consumption rate of batteries in mobile devices.

FIG. 6A shows a total average power consumption rate of a plurality of batteries. In the drawing, R_total indicates the average power consumption rate of the batteries. It should be noted that the average power consumption rate represents a total average of power consumption rates for all the batteries, regardless of a type of the batteries, a type of the mobile devices, usage patterns of users, and when the mobile device was used.

Figure 6B:
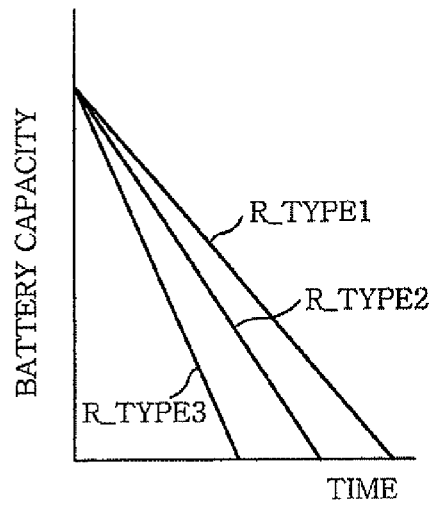
FIG. 6B shows an average power consumption rate in each type of battery and in each type of mobile device.

FIG. 6B shows the average power consumption rate of the batteries in each type of the mobile devices and each type of the batteries. In the drawing, R_type1, R_type2, and R_type3 have different values, respectively, depending on the type of the mobile device and the type of the battery. For example, it is noticed that the battery for R_type1 has a longer lifetime than the battery for R_type2.

Figure 6C:
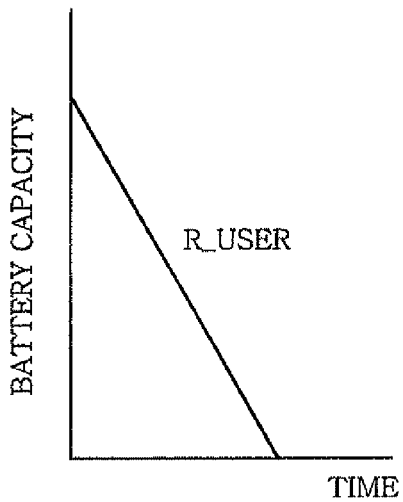
FIG. 6C shows an average power consumption rate depending on usage patterns of users.

FIG. 6C shows the average power consumption rate of the batteries by each usage patterns of users. In the drawing, R_user indicates the power consumption rate by the usage pattern of the users, which reflects the usage pattern in that a ratio of duration for three operational states (standby, data communication and voice communication states), i.e., a ratio of actual use time for each operational state, is different for every user.

Figure 6D:
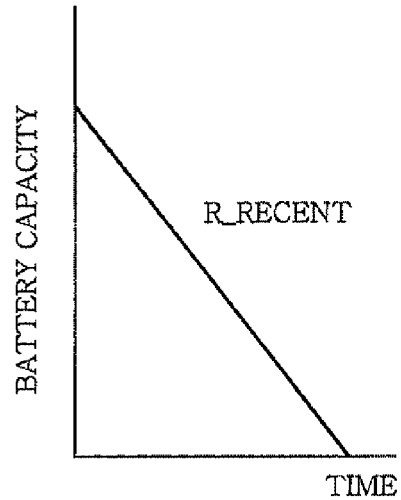
FIG. 6D shows an average power consumption rate used recently.

FIG. 6D shows the average power consumption rate of the battery used recently. In the drawing, R_recent indicates a recent power consumption rate of each user. Using this information reflects a recent trend even better if there is a certain change in the usage pattern of each user or in part or all of various mobile communication environments.

In short, the present invention suggests a hierarchical standard model, from which the average power consumption rate R_total for a plurality of the batteries is referred if there is no information on the mobile device, the average power consumption rate R_type is referred if information on both the mobile device and the battery is known, the average power consumption rate R_user is referred if the usage pattern of each user is known, and lastly the recent power consumption rate R_recent is referred as required. With more flexible application of the power consumption rate to the mobile device based on the above model, more precisely estimated available time of the battery can be acquired.

Figure 7:
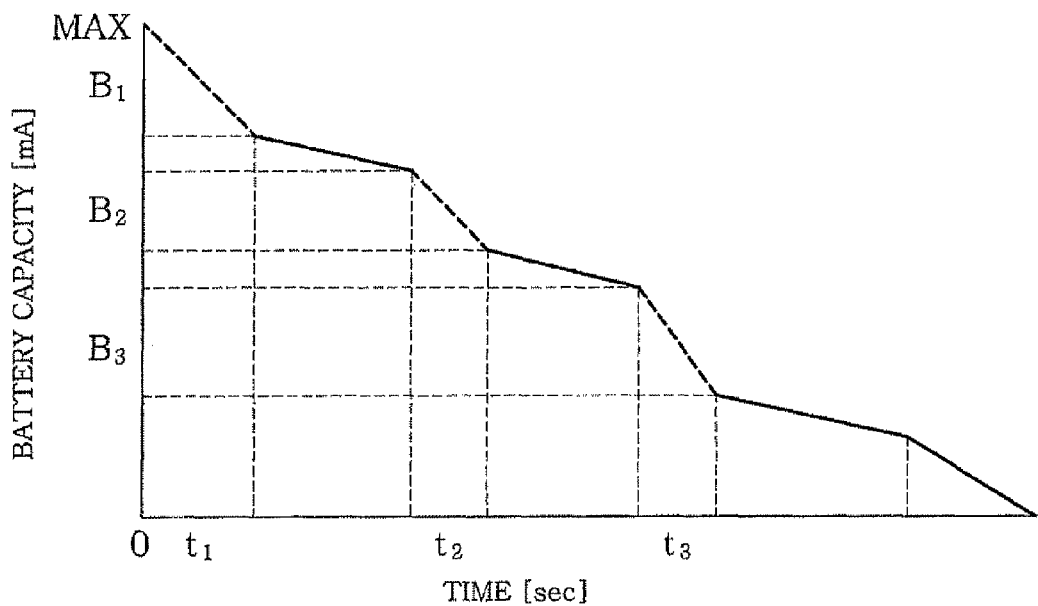
FIG. 7 graphically shows how to calculate an average power consumption rate based on measurements of power consumption amount of a battery by actual use time for each state of a mobile device.

FIG. 7 graphically shows how to calculate the average power consumption rate based on the power consumption amount measure during the actual use time in each state of the mobile device. The collector 222 collects time-series data on the power consumption amount [mA] of the battery, the voice communication time [sec], the data communication time [sec], and total time [sec]. Meanwhile, a standby time can be obtained by subtracting a sum of the voice communication time and the data communication time from the total time. In the graph of FIG. 7, the time-series data on the power consumption amount [mA] to the use time [sec] is plotted with a dashed line and a solid line. A slope for the dashed and solid lines has a unit of the power consumption rate [mA/sec]. Referring to the solid line, a section having a relatively gentle slope indicates the standby state 402 (S0), and a section having a relatively steep slope indicates the data communication state 403 (S1). Meanwhile, sections with dashed lines indicate the voice communication state 404 (S2).

Assuming that the power consumption rate of the respective batteries is constant under the same states of the respective mobile devices, information on how long a fully charged battery can last, i.e., the estimated available time of a battery in each state, when the mobile device stays in the same state without a transition, can be obtained using the use time of the battery for each section and the power consumption amount of the battery for each section. Plotted in FIG. 7 are the use time [sec] ($t_1, t_2, t_3$) and the power consumption amount of the battery [mA] (B1, B2, B3) in each section in the voice communication state 404 (S2). The estimated available time in each state can be obtained, using a partial sum in a section corresponding to a specific state, without having the specific state kept during the entire time that the battery is fully charged and is completely exhausted, by linear approximation as follows:

$$t_v = \frac{B_{MAX} \cdot (t_1 + t_2 + t_3)}{(B_1 + B_2 + B_3)} \qquad \text{Equation (1)}$$

wherein $t_v$ denotes the estimated available time [sec] when a fully charged battery is consumed exclusively for the voice communication, $B_{MAX}$ denotes a maximum battery capacity [mA] when the battery is fully charged, $B_j$ denotes the power consumption amount of the battery [mA] for a j-th voice communication section, and t denotes duration [sec] of a j-th voice communication section, where j=1,2,3, . . . .

Figure 8:
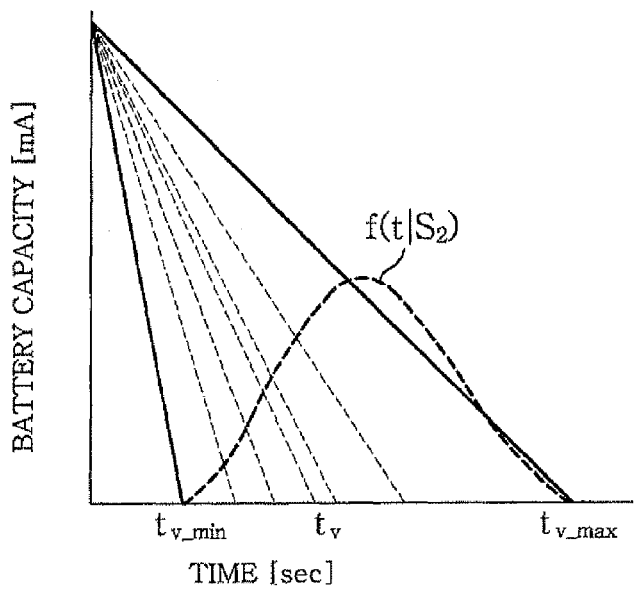
FIG. 8 plots distributions of estimated available time when a fully charged battery is to be consumed exclusively for voice communication.

FIG. 8 plots distribution of the estimated available time $t_v$ in FIG. 7, which is the estimated available time when a fully charged battery is consumed exclusively for the voice communication, using a probability density function $f(t/S_2)$. Now that power consumption of the battery in the mobile device is directly affected by the states such as the standby state 402 (S0), the data communication state 403 (S1), and the voice communication state 404 (S2), of the mobile device, and if there is given a learning model related to statistical values of the power consumption rate in a normal state and in an abnormal state, it becomes possible to detect the existence of abnormality in power consumption by observing changes in those values occurring for a certain operational period of time of the mobile device within a certain confidence interval.

Such detection is done as follows. In a first step, changes of values of the power consumption rate in the normal state and abnormal state are determined based on the time-series data. General information on those changes of the power consumption rates in both normal and abnormal states can be acquired by looking up samples in the external knowledge-information storage 240. In a second step, a proper measurement time period and a proper threshold are determined by using statistical data that is obtained based on the result from the first step, and then a diagnosis in each state is performed to determine whether or not a power of the battery is being consumed abnormally. Lastly, in a third step, if any one of the determination results in each state from the second step is in abnormal state, the power consumption is regarded as abnormal.

With the same type of the mobile device and the battery, under ideal environment with no jamming, the estimated available time $t_v$ will be as large as the maximum $t_{v\_max}$. Meanwhile, if the power of the battery has been consumed abnormally by various causes, the estimated available time $t_v$ will be as small as the minimum $t_{v\_min}$. This distribution can be expressed in a probability density function $f(t/S_i)$ of time that takes, in the $S_i$ state, to use up the fully charged battery. Although it is assumed in this embodiment that $f(t/S_i)$ follows a Gaussian distribution, $f(t/S_i)$ may also be modeled in other distributions.

Figure 9:
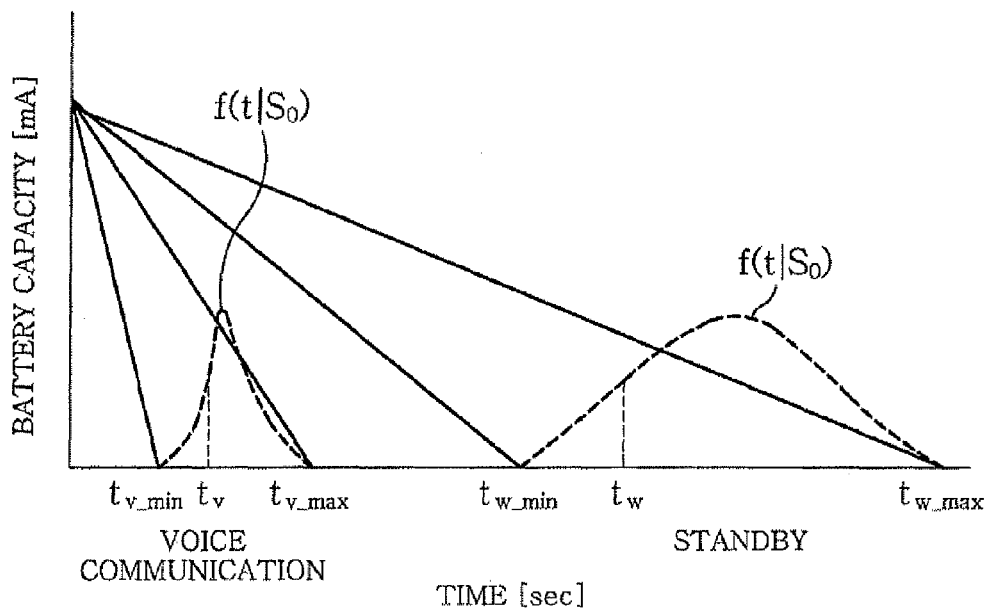
FIG. 9 plots respective distributions of estimated available time, when a fully charged battery is to be consumed for voice communication or standby state.

FIG. 9 plots respective distributions of the available time $t_v$ and available time $t_w$ measured when power of the fully charged battery is consumed in the voice communication state or in the standby state, using the probability density functions $f(t/S_2)$ and $f(t/S_0)$.

In FIG. 9, the distribution of $t_v$ is expressed in $f(t/S_2)$, and the distribution of $t_w$ is expressed in $f(t/S_0)$. Normally, on the time axis, the standby time $t_w$ is distributed on the right-hand side in a wider range than the voice communication time $t_v$. By using the probability density function $f(t/S_i)$ for estimated available time in each state $S_i$, an expected value for each state can be obtained as follows:

$$E[X''S_i] = \int_{-\infty}^{\infty} x f(x/S_i) dx \qquad \text{Equation (2)}$$

wherein $E[X/S_i]$ denotes an expected value of the estimated available time in the state $S_i$, and $f(t/S_i)$ denotes the probability density function for the estimated available time in the state $S_i$.

The expected value can be judged as follows to detect the existence of abnormality in power consumption.

$$\rho_i = \begin{cases} 0 \text{ (if } |[E[X \mid S_i] - \alpha_i| \leq \delta) \\ 1 \text{ (if not)} \end{cases}, i = 0, 1, 2 \qquad \text{Equation (3)}$$

$$\beta = \begin{cases} \text{Normal (if } \rho = 0) \\ \text{Abnormal (if not)} \end{cases}, \rho = \rho_0 \mid \rho_1 \mid \rho_2$$

wherein $\rho_i$ is either 0 or 1, depending on a detection result on the existence of abnormality in power consumption in the state $S_i$; $\alpha_i$ denotes an estimated value of the available time when the fully charged battery is consumed, based on the measurement result of the power consumption amount for a certain period of time in the state $S_i$; $E[X|S_i]$ denotes an estimated value of the available time when the fully charged battery is consumed in the state $S_i$; $\delta$ denotes a threshold value to determine the existence of abnormality in power consumption; and $\beta$ presents a detection result of the existence of abnormality in power consumption.

Figure 10:
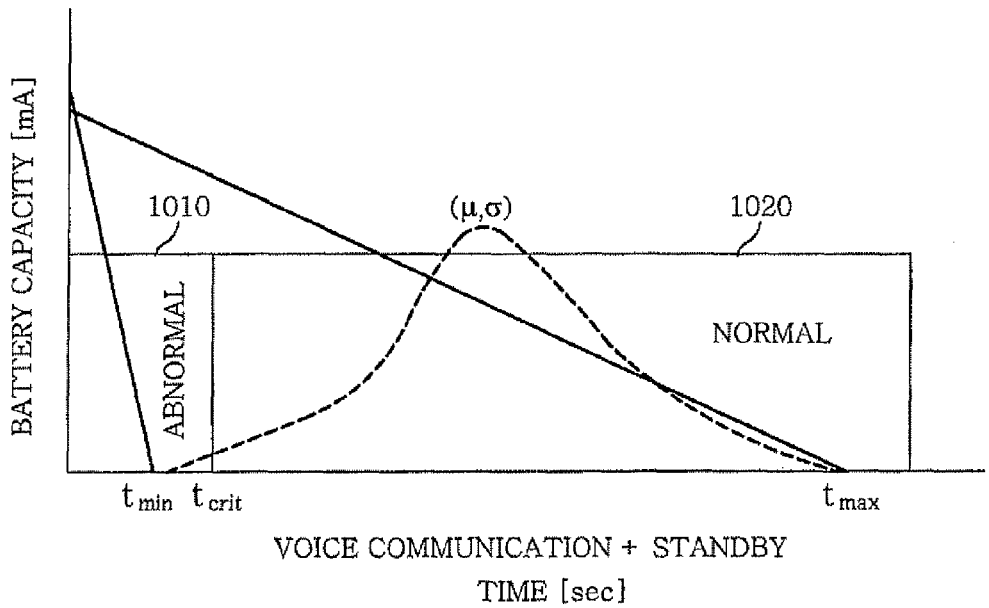
FIG. 10 graphically shows how to define an abnormal state and a normal state of power consumption in a mobile device using a confidence interval.

FIG. 10 graphically shows how to define the abnormal state and the normal state of the power consumption in the mobile device using a confidence interval. As noted in Equation 3 above, $\delta$ represents a threshold value used to judge whether the power of the battery is being consumed abnormally. The threshold value is used to determine a confidence interval (95% confidence interval, 99% confidence interval, etc.) based on the distribution of $f(t/S_i)$ as shown in FIG. 10, so that the normal state 1010 and abnormal state 1020 are defined by reference of a critical point $t_{crit}$ at a boundary of the confidence interval. The abnormal state corresponds to the interval where the estimated available time is shorter than the critical point $t_{crit}$. In other words, The abnormal state corresponds to the interval where the battery is consumed more than the other interval. Since the critical point $t_{crit}$ is not stationary but varies dynamically depending on how the user uses his or her mobile device, abnormal power consumption can be detected in accordance with user's aspects.

In accordance with the present invention, battery abuse caused by wrong use habits or device defect can be prevented by allowing a user to monitor whether the power of the battery in his or her mobile device is being consumed abnormally.

Moreover, by estimating the amount of available time of the battery based on the usage patterns of users, it is possible to achieve a user-oriented battery management in a more accurate and efficient manner.

While the present invention has been shown and described with respect to the embodiments, it will be understood by those skilled in the art that various changes and modification may be made without departing from the scope of the invention as defined in the following claims.

What is claimed is:

1. A method for detecting abnormal power consumption of respective batteries in mobile devices, comprising:
   defining one or more operational states affecting power consumption of the batteries;
   collecting time-series data on an amount of the power consumption and use time of each battery in each of the operational states;
   calculating a power consumption rate, usage patterns, and an actual use time of the individual batteries based on the time-series data;
   estimating an amount of an available time remaining on the individual batteries based on average power consumption rate of all of the batteries; and
   comparing the estimated available time with the actual use time of the individual batteries to judge whether a power of the individual batteries is being consumed abnormally.

2. The method of claim 1, wherein the operational states include a standby state, a voice communication state, and a data communication state of the mobile device.

3. The method of claim 1, wherein the usage pattern is defined as a ratio of actual use time of the battery for each of the operational states.

4. The method of claim 1, wherein the average power consumption rate of all of the batteries is updated based on the calculated power consumption rate of the individual batteries.

5. The method of claim 1, wherein the average power consumption rate of all of the batteries includes an average power consumption rate of batteries by categorized groups.

6. The method of claim 5, wherein the categorized groups include a group by a type of the mobile devices and a type of the batteries, a group by usage patterns, and a group of the mobile devices used recently.

7. The method of claim 1, further comprising:
   reporting to a user the judgment result on whether a power of the battery is being consumed abnormally.

8. The method of claim 7, wherein the report is conveyed to the user through at least one of image, audio or vibration.

9. The method of claim 1, wherein the available time is estimated by dividing an actual capacity of the battery by the average power consumption rate of all of the batteries.

10. The method of claim 5, wherein the available time is estimated by dividing an actual capacity of the battery by the power consumption rate, and
    wherein the power consumption rate is obtained based on the average power consumption rate of all of the batteries or the average power consumption rate of each group.

11. The method of claim 1, wherein said comparing the actual use time of the battery with the estimated available time of the battery includes:
    diagnosing, on the basis of the time-series data, changes of a value of the power consumption rate in respective status where a power of the battery is being consumed normally or abnormally;
    setting, on the basis of the changes, a measurement time period and a threshold value required for judging whether a power of the battery is being consumed abnormally;
    executing, on the basis of both the measurement time period and the threshold value, a diagnosis of power consumption of the battery in each of the operational states; and
    if abnormality in power consumption of the battery is detected from at least one operational state in a result of the diagnosis, determining that the power of the battery is being consumed abnormally.

12. An apparatus for detecting abnormal power consumption of respective batteries in mobile devices, comprising:
    a collector for collecting time-series data on an amount of a power consumption and use time of each battery in one or more operational states affecting the power consumption of the batteries;
    an analyzer for calculating a power consumption rate, usage patterns, and an actual use time of the individual batteries based on the time-series data;
    a planner for estimating an amount of available time remaining on the individual batteries on the basis of an average power consumption rate of all of the batteries, and for comparing the estimated available time with the actual use time of the individual batteries to judge whether a power of the individual batteries is being consumed abnormally; and
    an executor for reporting to a user the judgment result on whether the power of the battery is being consumed abnormally.

13. The apparatus of claim 12, further comprising:
    an external knowledge-information storage storing the average power consumption rate of all of the batteries,
    wherein the average power consumption rate of all of the batteries stored in the external knowledge-information storage is updated based on the calculated power consumption rate of the individual batteries.

14. The apparatus of claim 13, further comprising internal knowledge-information storage, located in the mobile device, for storing the same average power consumption rate of all of the batteries as that stored in the external knowledge-information storage.

15. The apparatus of claim 12, further comprising a sensor, connected to the battery, for detecting the time-series data on the power consumption amount and the use time of the battery.

16. The apparatus of claim 12, further comprising an actuator, connected to the executor, for reporting to a user the judgment result on whether a power of the battery in the mobile device is being consumed abnormally.

17. The apparatus of claim 16, wherein the actuator includes at least one of a display for informing the abnormality of the user by using a visual image, a speaker for informing the abnormality of the user by using an aural sound, and a vibration motor for informing the abnormality of the user by using a vibration.

* * * * *